Figure 1:
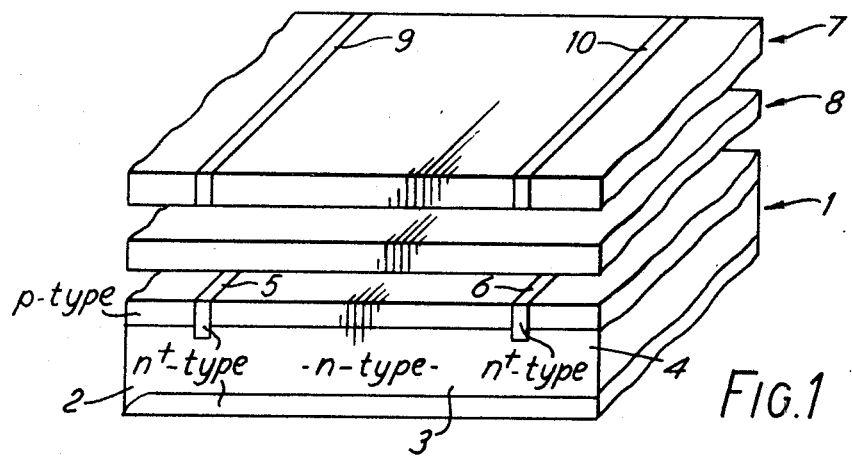

United States Patent [19]

Haque

[11] 4,288,264
[45] Sep. 8, 1981

[54] DETECTOR CONSTRUCTION

[75] Inventor: Promod Haque, Evanston, Ill.

[73] Assignee: EMI Limited, Hayes, England

[21] Appl. No.: 96,436

[22] Filed: Nov. 21, 1979

[51] Int. Cl.$^3$ .......................................... H01L 31/18
[52] U.S. Cl. .................................. 156/67; 427/2; 427/64; 427/65; 427/73
[58] Field of Search ................ 156/67; 427/2, 64, 65, 427/73

[56] References Cited

U.S. PATENT DOCUMENTS

| 2,694,153 | 11/1954 | Reuter | 156/67 X |
| 3,458,700 | 7/1969 | Kohashi | 250/71 |
| 3,778,614 | 12/1973 | Hounsfield | 250/362 |
| 3,924,129 | 12/1975 | Lemay | 250/362 X |
| 3,932,756 | 1/1976 | Cowell et al. | 250/313 |

FOREIGN PATENT DOCUMENTS 1452898 10/1976 United Kingdom .
1467010 3/1977 United Kingdom .
1476450 6/1977 United Kingdom .

OTHER PUBLICATIONS

Haque et al., "X-ray-sensitive Vidicon Tube for Low-Level Radiation Imaging", *J. Appl. Phys.*, vol. 48, No. 7, pp. 2655–2659 (Jul. 1977).

Primary Examiner—James R. Hoffman
Attorney, Agent, or Firm—Cooper, Dunham, Clark, Griffin & Moran

[57] ABSTRACT

Methods for constructing radiation sensitive detectors are described. In one method, distinct layers of optical cement and plastics material are disposed between a semiconductor photodiode and a layer of rare earth phosphor in order to permit the phosphor and the plastics material to be peeled from the optical cement without damaging the photodiode in the event of a problem arising with the deposition of the phosphor layer. The phosphor layer may be loaded with heavy metal such as lead or tin. In the event that an array of semiconductive photodiodes is used, with stopper channels between adjacent diodes, the plastics material is preferably provided with markings overlying the stopper channels so as to reduce optical cross-talk between adjacent detectors.

7 Claims, 2 Drawing Figures

U.S. Patent

Sep. 8, 1981

4,288,264

DETECTOR CONSTRUCTION

The present invention relates to methods of constructing detector arrangements for producing electrical output signals in response to penetrating radiation, such as x- or γ-radiation. The detector arrangements constructed in accordance with this invention may be used, for example, in medical diagnostic radiographic apparatus of the kind now known as computerised tomographic apparatus.

In computerised tomography, a source of radiation, such as x-radiation, is scanned around a cross-sectional slice of a patient's body so as to irradiate that slice from many different directions. Radiation data, indicative of the amounts of radiation emergent from the slice along many substantially linear paths thereacross, are detected by detecting means which may or may not scan relative to the body. As a result of the scanning movement imparted to the source, some of the paths intersect within the patient's body and the arrangement is such that the number of paths and the number of intersections is sufficient to permit the use of the detected radiation data to evaluate the variation of absorption (or transmission) of the radiation with position over the slice. A representation of the said variation is produced and such representations have been found most valuable in assisting physicians to diagnose various diseases and injuries.

Computerised tomography was invented by Godfrey Newbold Hounsfield of the British company EMI Limited, the assignee of this invention, and is described and claimed in his U.S. Pat. No. 3,778,614. Said patent indicates not only how to acquire the aforementioned radiation data but also how to process the data to effect the evaluation and to produce the representation. The processing can alternatively be effected in the manner described in C. A. G. LeMay's U.S. Pat. No. 3,924,129.

With the development of the technology of computerized tomography, one common tendency has been to speed up the rate of acquisition of the radiation data, with the objects of increasing patient throughput and improving the accuracy of the representations produced by reducing the effects of movement of the body under examination, and/or of matter within the body, during the data acquisition period. This development tends to place considerable demands upon the detectors used to detect the radiation.

A consequence of the desire to speed up the data acquisition rate of computerised tomographic apparatus is that it has become usual to employ considerable numbers of detectors. In some systems, a thousand or more are used. These detectors are expensive components and it is thus an object of this invention to provide a method of constructing detector arrangements including many individual detectors which permits the retrieval of the expensive detector material should something go wrong during the construction.

When large numbers of detectors are used, it is desirable that cross-talk, both optical and electrical, between different detectors be as small as possible, and it is another object of this invention to provide a method of constructing detector arrangements in which such cross-talk between different detectors is small.

Figure 2:
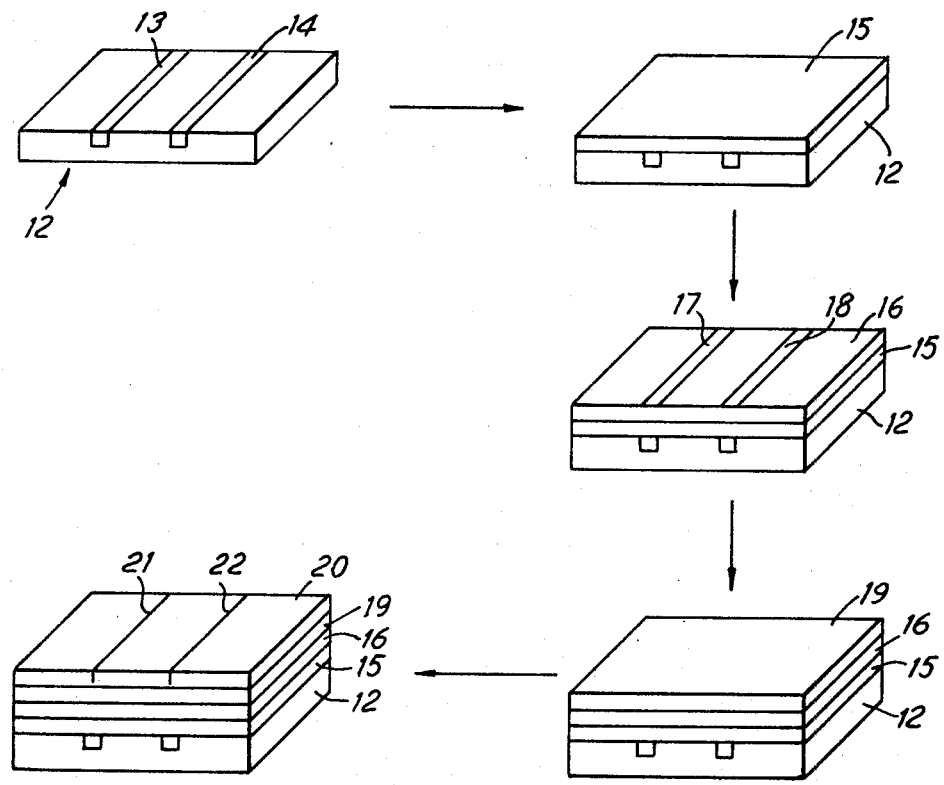

In order that the invention may be clearly understood and readily carried into effect, some embodiments thereof will now be described, by way of example only, with reference to the accompanying drawings, of which:

FIG. 1 shows, in exploded view, part of a detector arrangement constructed in accordance with a method constituting one example of this invention, FIG. 2 indicates, schematically, a flow diagram of steps to be followed in performing a method in accordance with one example of this invention.

Referring now to FIG. 1, part of an array of silicon photodiodes is shown at 1, the individual diodes being indicated at 2, 3 and 4. There are "dead" spaces such as 5 and 6 provided, in known manner, in the form of channel stoppers of $n^+$ material between adjacent diodes in order that the diodes can be caused to provide individual output signals with no substantial electrical cross-talk between them. The $n^+$ material is preferably maintained at a positive potential relative to ground. The array, as can be seen, is linear but an arcuate array or one conforming to some other geometry can be constructed if desired.

Deposited on the array 1 of diodes is a phosphor screen 7 which acts as a scintillator, producing light in response to incident x-radiation. The light falls upon the photodiodes and these latter components produce electrical output signals in response to the light. Conversion from x-radiation to electrical signals is thereby achieved. Conveniently, the phosphor can comprise one of the following:—$Gd_2O_2S:Pr$, $Gd_2O_2S:Tb$, $Gd_2O_2S:Eu$, $CaWO_4$ or $BaFCl:Eu$, but other phosphors can be used if desired.

It is convenient, although not necessary, to dispose a layer of silicon grease between the phosphor screen 7 and the diode array 1, to act as a coupling agent.

The deposition of the screen 7 on to the array 1 can be effected in many different ways, but one example is for the phosphor material to be made into a slurry with an optical cement or an epoxy material and deposited on the array by a silk screening technique of the kind well known in the deposition of thick films in hybrid circuits. The thickness of the film is typically of the order of 0.75 to 2.00 millimeters, depending upon the absorption required.

In order to reduce optical cross-talk between adjacent detectors, it is desirable for the phosphor screen 7 to be slotted as indicated at 9 and 10. The slots such as 9 and 10 are disposed to overlie the dead spaces such as 5 and 6 between adjacent photodiodes. The slots such as 9 and 10 may include means (not shown), such as lead or tantalum spacers or aluminium foil, for reducing x-ray cross-talk as between adjacent detectors. Preferably, the slots contain lead spacers and a layer of aluminium foil is provided over the X-ray receiving surface of the phosphor screen 7.

It will be appreciated that the process of depositing the phosphor screen 7 on to the diode array 1 is a delicate operation and that there is always a possibility that some problem will occur during the deposition which could render the detector arrangement unserviceable. In order that, if some problem does arise, the expensive array 1 of silicon photodiodes can be salvaged, the invention provides for easy removal of the screen 7 from the array 1. In accordance with this example of the invention, the surface of the photodiode array which is to be coupled to the screen is coated with a layer, of 1 to 2 mils. thickness, of an optical cement such as lens Bond, made by Summers Labs, or HE-79 or HE-80m both made by Kodak or any other transparent coating. A thin sheet of plastics material 8 such as that known as "Mylar," about 1 or 2 mils in thickness, is applied on top of the layer of optical cement. The slurry of the phosphor material with the optical cement or epoxy material is then deposited on top of the sheet of Mylar. It has been found that the sheet of Mylar can be easily peeled from the layer of Lens Bond or HE-79 optical cement so that, in the event of some problem arising with the deposition, the phosphor screen, adhering to the Mylar sheet, can be removed from the photodiode array and a fresh deposition can be made upon that array. Again, it can be advantageous to employ a layer of silicon grease as a coupling agent between the phosphor screen and the Mylar sheet. Instead of Mylar, the sheet of plastics material 8 may consist of Saran Wrap or any low density plastic with low concentration of high mobility ions such as sodium, potassium, etc.

It will be appreciated that, whilst the technique described in the immediately preceding paragraph has considerable benefits in improving yield during manufacture, the fact that extra layers are interposed between the phosphor screen and the diode array gives rise to a finite possibility of optical cross-talk between adjacent detectors, even if the phosphor screen is slotted. In order to reduce or eliminate such optical cross-talk, another aspect of this invention provides for the formation of a geometrical pattern, such as a printed array of parallel stripes on the sheet 8 of plastic material. This pattern preferably conforms identically to that used on the photodiode array 1 to create the aforementioned dead spaces on the silicon surface. The pattern on the sheet 8 is made opaque and non reflective, for example by printing the pattern in matt black ink or paint.

It can be advantageous, in any of the arrangements described so far, to load the phosphor screen with particles of a heavy metal such as tin or lead. Lead powder with a grain size of about 8 or 9 microns can be added to the phosphor powder while making up the slurry. The lead loading not only increases the absorption of the detector but also causes emission of secondary electrons which interact with the phosphor and cause cathodoluminescence.

The concept of using a lead layer to create secondary electrons which are then used for imaging purposes is described in a paper entitled "X-Ray Sensitive Vidicon Tube for Low Level Radiation Imaging" by P. Haque (the inventor of this invention) and J. E. Jacobs, published in the Journal of Applied Physics, Vol. 48, No. 7, July 1977, pages 2655 to 2659. It is also pointed out that no claims are being made herein for the phosphor materials per se. These materials are described, for example, in British Pat. Nos. 1,467,010 and 1,452,898. However neither of these patents teaches the construction of a detector arrangement of the phosphor material in conjunction with a photodiode array as described herein.

It is not necessary for the phosphor material to be deposited as a screen. If desired, a crystal can be grown and coupled to the photodiodes in the same way as conventional sodium iodide, caesium iodide or Bismuth Germinate scintillators. Indeed, the method, described hereinbefore, of printing or otherwise providing a pattern of opaque, preferably non-reflective, lines on a sheet of plastic material, such as Mylar, disposed between a light emitting material and a photodiode to reduce optical cross-talk between adjacent detectors, can be applied advantageously to cases in which such a crystal of phosphor or conventional scintillators are used.

An exemplary flow diagram of steps to be followed in performing a method in accordance with an example of the invention will now be described with reference to FIG. 2. In FIG. 2 an array of only three detectors is constructed, but it will be appreciated that in practice many more detectors will be included.

Firstly, an array 12 of three silicon photodiodes is provided, having dead spaces such as 13, 14 in the form of $n^+$ channel stopper between adjacent diodes. The upper surface of the array is then coated with optical cement (e.g. Lens Bond, HE-79 or HE-80 as previously noted). The layer of optical cement is shown at 15. A sheet 16 of Mylar is then provided on top of the layer 15; the sheet having markings 17, 18 of opaque, preferably non-reflective ink or paint thereon. These markings, 17 and 18, overlie the aforementioned dead spaces 13 and 14, and the markings are preferably applied with the sheet 16 in situ. In the next stage, which is optional, a layer 19 of silicon grease is applied on top of the sheet 16 and finally the slurry of phosphor material with optical cement or epoxy material (and possibly also lead or tin powder) is applied, by silk screening, for example, as a layer 20, on top of the layer 19. The layer 20 may be formed with slots to contain lead or other spacers as previously mentioned. These slots are shown in FIG. 2 at 21 and 22 and it will be appreciated that they overlie both the markings 17, 18 and the dead spaces 13 and 14.

It is the usual practice to provide a layer of aluminum (not shown) which completely covers the radiation-receiving surface of the layer 20 and extends down the sides thereof as far as the upper surface of the sheet 16. The presence of the sheet 16 permits the $n^+$ channel stoppers in the detector array 12 to be maintained at a positive potential without shorting out to the aluminium layer, which latter is grounded, via the lead spacers in the layer 20. Maintaining the $n^+$ channel stoppers at a positive potential with respect to ground assists in restricting the lateral diffusion of carriers generated adjacent the dead spaces 13 and 14.

The presence of the sheet 20 has yet a further advantage in that the silicon surface (without passivation) is less likely to be damaged during manufacture than would be the case without the sheet.

Those skilled in the art will readily appreciate that the scope of the invention is not limited to the specific example described hereinbefore. For example, it is possible to construct detectors similar to those described hereinbefore but with layers of scintillator material on both sides of an array of photodiodes (such as 12). In accordance with an example of this invention, both layers can be separated from the array by respective sheets or layers of plastics material.

It is also possible to utilise the invention in the manufacture of large two-dimensional arrays of detectors for use in place of the conventional film in standard flat-plate radiography or computed tomography. Apart from the fact that a two-dimensional array of diodes and phosphor is called for, the constructional details can be substantially the same as those described hereinbefore with reference to the drawings.

What I claim is:

1. A method of constructing a detector arrangement for producing electrical output signals in response to penetrating radiation comprising the steps of providing at least one semiconductive photodiode, forming a layer of optical cement on said at least one photodiode, providing a layer of plastics material, which readily peels from said optical cement, on said layer of optical cement, and depositing a layer of phosphor material on said plastics material.

2. A method according to claim 1 including the further step of depositing a layer of material to act as a coupling agent between said plastics material and said layer of phosphor material.

3. A method according to claim 1 wherein said at least one diode comprises an array of photodiodes with stopper channels between adjacent photodiodes, including the further step of providing opaque markings on said plastics layer, said markings substantially overlying said stopper channels.

4. A method according to claim 3 including the further step of forming slots in said phosphor material, said slots substantially overlying said markings and said stopper channels.

5. A method according to claim 1 including the step of forming said phosphor material into a slurry with either an optical cement or an epoxy material prior to depositing said material on said at least one photodiode.

6. A method according to claim 5 including the further step of adding a loading material, chosen from the materials lead and tin, in powder form to said slurry.

7. A method according to claim 1 wherein said at least one semiconductive photodiode is formed of silicon.

* * * * *